United States Patent [19]

Klement et al.

[11] Patent Number: 4,457,467
[45] Date of Patent: Jul. 3, 1984

[54] METHOD FOR POSITIONING AND FIXING OPTICAL COMPONENTS RELATIVE TO ONE ANOTHER

[75] Inventors: Ekkehard Klement, Munich; Julius Wittman, Deisenhofen, both of Fed. Rep. of Germany

[73] Assignee: Siemens Aktiengesellschaft, Berlin and Munich, Fed. Rep. of Germany

[21] Appl. No.: 400,956

[22] Filed: Jul. 22, 1982

[30] Foreign Application Priority Data

Sep. 25, 1981 [DE] Fed. Rep. of Germany ....... 3138296

[51] Int. Cl.$^3$ .............................................. B23K 31/02
[52] U.S. Cl. ..................................... 228/103; 228/105; 228/121; 228/188; 228/213
[58] Field of Search ................... 228/103, 105, 180 A, 228/188, 121, 123, 124, 212, 213

[56] References Cited

U.S. PATENT DOCUMENTS 3,909,933 10/1973 Doubek, Jr. et al. .......... 228/213 X
4,116,376 9/1978 Delorme et al. .................... 228/105
4,283,845 8/1981 Sigel et al. .............................. 29/739
4,342,090 7/1982 Caccoma et al. .......... 228/180 A X
4,352,449 10/1982 Hall et al. ........................ 228/180 A Primary Examiner—Kenneth J. Ramsey
Attorney, Agent, or Firm—Hill, Van Santen, Steadman & Simpson

[57] ABSTRACT

A method for positioning and fixing optical components relative to one another which comprises the steps of providing a carrier plate having an optical component, securing an optical component on a retainer plate having at least one solderable area, positioning the retainer plate above the carrier plate with a reference mark on said plates being aligned and the solderable area on each of the two plates being disposed in aligned pairs of solderable areas, applying at least one solder piece to each pair of solderable areas as the plates are held in the position, melting the solder pieces, allowing the molten metal to solidify to secure the aligned plates together and then releasing the secured aligned plates.

15 Claims, 2 Drawing Figures

METHOD FOR POSITIONING AND FIXING OPTICAL COMPONENTS RELATIVE TO ONE ANOTHER

BACKGROUND OF THE INVENTION

The present invention is directed to a method for positioning and fixing optical components relative to one another.

Optical components is a term used to include different optical elements which have small dimensions such as miniaturized light sources and lenses, and it also includes light waveguides as well as semiconductor laser diodes, light-emitting diodes and microlenses. These components can be secured in specially constructed but expensive micromanipulators. The elements can be positioned relative to one another and secured or bonded by means of a suitable design of the surfaces. If the elements were manufactured with extreme precision, the cost for the positioning mechanism, such as a micromanipulator, could be reduced. However, the manufacture of elements with such precision would involve very high cost.

SUMMARY OF THE INVENTION

The present invention is directed to providing a method for positioning and fixing optical components relative to one another with a high precision in a low cost manner in which the components can be fixed and secured without using adhesive which may damage the component. This object is achieved by a method comprising the steps of providing a carrier plate having an optical component secured thereon and having at least one solderable area, providing a retaining plate having at least one solderable area, securing at least one component on the retaining plate, positioning the retaining plate above the carrier plate with a reference mark of each of the plates being aligned and the solderable areas of the retaining plate being disposed in alignment with the solderable areas of the carrier plate to form aligned pairs, while continuing to hold the plates in the aligned position, applying at least one solder piece at each aligned pair of solder areas, melting the solder pieces, allowing the molten solder to solidify to secure the aligned plates together and then releasing the holding of said plates.

With the proposed method, the optical components can be positioned and secured relative to one another with a precision of less than 1 μm and with an angular fluctuation of less than 0.5°. Thus, no adhesive, for example, a two-component adhesive, is required. Preferably, the retaining plate and the carrier plates have means for fastening to a micromanipulator which will position the plates to form the aligned pairs of solderable areas and hold the plates in the aligned position during the soldering steps. Preferably, the retaining plate and/or the carrier plate will consist of a material which has a poor thermal conductivity and if this material is a non-metallic material, it is provided with metallized layers to form a solderable area. When applying a metallized layer on the retaining plate, it is applied adjacent to the periphery of the plate on a lower surface and also on the adjacent peripheral edge. This metallization can be a complete metallization or only a partial metallization. It is desirable to metallize the plates with an easy to solder metal such as gold. The material of the plates may be either a ceramic material or a semiconductor material such as silicon.

In order to locate the component on the retaining plate, the step of providing the plate includes forming at least one groove for each component on a surface of the plate. If the retaining plate is made of silicon, the step of forming the groove is by etching.

The step of providing the solder pieces preferably provides solder pieces in the form of either a ball or a cylindrical-shaped solder form. Preferably, the solder is composed of an alloy which shows no significant change of volume between its solid and melted form so that on solidification no shrinkage will occur.

The step of melting the solder can be accomplished by utilizing an electromagnetic radiation or by utilizing a light energy.

As mentioned hereinabove, the process is particularly useful for positioning and securing semiconductor laser diodes, light-emitting diodes, microlenses and light waveguides relative to one another.

DESCRIPTION OF THE PREFERRED EMBODIMENTS

The principles of the present invention are utilized in the method in which n components are to be positioned and secured relative to one another. The method proceeds, for example, in such a manner that one component, for example, a semiconductor laser diode is secured to a carrier plate. The remaining n−1 components are then secured to one or more retaining plates and these retaining plates are then adjusted and positioned on the carrier plate and secured to the carrier plate by means of the method of the present invention. The retaining plates preferably consist of silicon and contain etched grooves in which the optical components can be secured. However, retaining plates of other materials, predominantly materials with a low thermal conductivity such as ceramic retaining plates, are also usable. The retaining plates are preferably partially metallized on their peripheral edge and also on a lower surface adjacent to the peripheral edge. The metallization should consist of a layer of material which is easy to solder, for example, gold. Both the retaining plates and the carrier plates should have means for securing them in a micromanipulator which will position and hold the plates so that the retaining plate is only a few 100 μm above the surface of the carrier plate which also consists of a material exhibiting a poor thermal conductivity. The carrier plate is also at least partially metallized to provide solderable areas.

Each of the retaining plates is then adjusted or positioned relative to the optical component already secured on the carrier plate with the assistance of the micromanipulator. This adjusting also aligns the metallized solderable areas of the retaining plate to be disposed above metallized areas on the carrier plate to form metallized pairs. While holding the plates in the aligned position with the micromanipulator, solder pieces such as balls or cylindrical forms are positioned at each of the pairs of metallized areas. Subsequently, the solder forms are melted and then allowed to solidify to secure the plates together. After this has occurred, then the plates are released from the micromanipulator.

Figure 1:
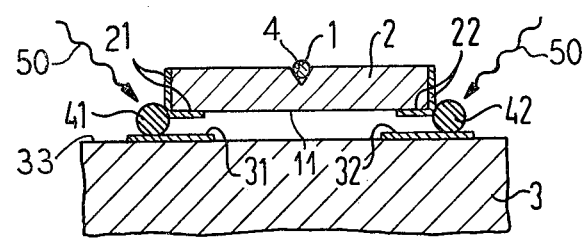
FIG. 1 is a cross-sectional view of a retaining plate being positioned on a carrier plate in accordance with the present invention with portions in elevation for purposes of illustration.

As illustrated in FIG. 1, a retaining plate 2 on an upper surface is provided with a groove 4 which receives an optical component such as a glass fiber 1 that is secured therein. The retaining plate 2 is rectangular and is positioned with a bottom surface 11 adjacent an upper surface 33 of a carrier plate 3 which has another component secured thereon. As illustrated, the rectangular carrier plate has a portion of its two opposite edges provided with a layer 21 and 22, respectively, of an easily solderable metal and each of the layers 21 and 22 also extend over a portion of the bottom surface 11 adjacent the edge. The carrier plate 3 is also provided with a pair of metallized areas 31 and 32 which form solderable areas which are spaced apart substantially the same distance as the metal layers 21 and 22 on the retaining plate 2.

With the plate 2 being positioned above the surface 33 of the plate 3 with a small spacing of a few 100 μm, the metallized, solderable areas form aligned pairs such as an aligned pair formed by the areas 21 and 31 and the other aligned pair of areas 22 and 32. Solder pieces, which have a circular cross-section such as balls or cylindrical solder form, are positioned with one piece or form 41 for the aligned pair 21, 31 and a piece or form 42 for the aligned pair formed by the areas 22, 32.

Figure 2:
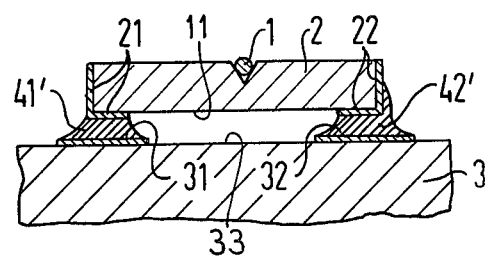
FIG. 2 is a cross-sectional view of the arrangement of FIG. 1 after the solder has solidified.

To melt the solder pieces 41 and 42, suitable means are provided. For example, the pieces may be melted by applying electromagnetic radiation or light energy as illustrated by energy waves 50. Preferably, the solder is an alloy which will experience no change of volume upon solidification. Thus, when the solder forms 41 and 42 melt, the solder will flow between the metallized areas to form metal stays extending between the two plates. Upon solidification, these metal stays 41' and 42' (FIG. 2) will secure the plates together and then the micromanipulator can be released.

Although various minor modifications may be suggested by those versed in the art, it should be understood that we wish to embody within the scope of the patent granted hereon, all such modifications as reasonably and properly come within the scope of our contribution to the art.

We claim:

1. A method for positioning and fixing optical components relative to one another, said method comprising the steps of providing a carrier plate having an optical component secured thereon and having at least one solderable area, providing a retaining plate having at least one solderable area, securing at least one optical component on said retaining plate, positioning the retaining plate above the carrier plate with a reference mark on each of said plates being aligned and the solderable area of the retaining plates being disposed in alignment with solderable areas on the carrier plate to form aligned pairs, while continuing to hold the plates in the aligned position applying at least one solder piece at each aligned pair of solderable areas, melting the solder pieces, allowing the molten solder to solidify to secure the aligned plates together and then releasing the holding of said plates.

2. A method according to claim 1, which includes providing a micromanipulator, said step of providing the retaining plate include providing a plate having means for fastening to a micromanipulator; and said step of positioning the retaining plate above the carrier plate with a reference mark on each plate being aligned include utilizing the micromanipulator to position and hold the retaining plate over the carrier plate.

3. A method according to claim 1, wherein the method of providing a retaining plate and providing a carrier plate provides one of the plates consisting of material exhibiting poor thermal conductivity.

4. A method according to claim 1, wherein the step of providing the retaining plate and the step of providing the carrier plate provides at least one of the plates being composed of a non-metallic material, each plate of non-metallic material having solderable areas formed by a metallized layer.

5. A method according to claim 4, wherein the one plate is the retaining plate and the metallized layer is provided on the entire peripheral edge and on a surface adjacent said peripheral edge.

6. A method according to claim 4, wherein the non-metallic plate is the retaining plate and the metallized layer is provided on portions of the peripheral edge and a surface adjacent said portion of the peripheral edge.

7. A method according to claim 4, wherein the step of providing the metallized layers provides a gold layer.

8. A method according to claim 1, wherein the step of providing a retaining plate provides a plate consisting of a material selected from a group consisting of semiconductor material and ceramic materials, said plate being provided with metallized layers to form the solderable areas.

9. A method according to claim 1, wherein the step of providing a retaining plate provides a retaining plate having at least one groove for positioning the optical component to be secured thereon.

10. A method according to claim 9, wherein the retaining plate with at least one groove comprises providing a silicon plate and etching each groove therein.

11. A method according to claim 1, wherein the step of applying at least one solder piece provides solder pieces having a circular cross-section.

12. A method according to claim 1, wherein the method of providing solder pieces provides solder composed of an alloy having no significant change of volume upon solidification from the melted phase.

13. A method according to claim 1, wherein the step of melting the solder comprises applying electromagnetic radiation to melt said solder.

14. A method according to claim 13, wherein the step of applying electromagnetic radiation applies light energy.

15. A method according to claim 1, wherein the step of providing a carrier plate having an optical component secured thereon and securing an optical component on the retaining plate comprises selecting the optical components from a group consisting of semiconductor laser diodes, light-emitting diodes, microlenses, and light waveguides.

* * * * *